United States Patent
Tsu et al.

(10) Patent No.: US 10,203,526 B2
(45) Date of Patent: Feb. 12, 2019

(54) TYPE III HETROJUNCTION—BROKEN GAP HJ

(71) Applicant: THE UNIVERSITY OF NORTH CAROLINA AT CHARLOTTE, Charlotte, NC (US)

(72) Inventors: Raphael Tsu, Huntersville, NC (US); Michael Fiddy, Huntersville, NC (US); Tsinghua Her, Charlotte, NC (US)

(73) Assignee: THE UNIVERSITY OF NORTH CAROLINA AT CHARLOTTE, Charlotte, NC (US)

( * ) Notice: Subject to any disclaimer, the term of this patent is extended or adjusted under 35 U.S.C. 154(b) by 330 days.

(21) Appl. No.: 15/203,458

(22) Filed: Jul. 6, 2016

(65) Prior Publication Data

US 2017/0010484 A1  Jan. 12, 2017

Related U.S. Application Data

(60) Provisional application No. 62/188,806, filed on Jul. 6, 2015.

(51) Int. Cl.

| | |
|---|---|
| *G02F 1/015* | (2006.01) |
| *H01L 33/06* | (2010.01) |
| *H01L 33/30* | (2010.01) |
| *H01L 33/32* | (2010.01) |
| *H01L 33/00* | (2010.01) |

(Continued)

(52) U.S. Cl.
CPC ............ *G02F 1/015* (2013.01); *G02B 5/008* (2013.01); *H01L 33/0062* (2013.01); *H01L 33/0075* (2013.01); *H01L 33/06* (2013.01); *H01L 33/30* (2013.01); *H01L 33/32* (2013.01); *H02S 40/44* (2014.12)

(58) Field of Classification Search
CPC . H01L 31/03; H01L 31/0352; H01L 31/0304; H01L 31/03044; H01L 31/1856; G02F 1/105
See application file for complete search history.

(56) References Cited

U.S. PATENT DOCUMENTS

| 4,163,237 A | 7/1979 | Dingle et al. |
| 4,482,779 A | 11/1984 | Anderson |
| 5,059,545 A | 10/1991 | Frensley et al. |

(Continued)

FOREIGN PATENT DOCUMENTS

| EP | 2 405 037 A1 | 1/2012 |
| JP | 2000-114594 A | 4/2000 |

OTHER PUBLICATIONS

Jun. 12, 2014 Search Report issued in International Application No. PCT/US2014/019032.

(Continued)

*Primary Examiner* — Phuc Dang
(74) *Attorney, Agent, or Firm* — Oliff PLC

(57) ABSTRACT

A semiconductor junction may include a first layer and a second layer. The first layer may include a first semiconductor material and the second layer may be deposited on the first layer and may include a second material. The valence band maximum of the second material is higher than a conduction band minimum of the first semiconductor material, thereby allowing a flow of a majority of free carriers across the semiconductor junction between the first and second layers to be diffusive.

20 Claims, 6 Drawing Sheets

(51) Int. Cl.
*G02B 5/00* (2006.01)
*H02S 40/44* (2014.01)

(56) References Cited

U.S. PATENT DOCUMENTS

| | | | |
|---|---|---|---|
| 5,144,378 | A | 9/1992 | Hikosaka |
| 5,302,840 | A | 4/1994 | Takikawa |
| 7,177,515 | B2 | 2/2007 | Estes et al. |
| 7,180,066 | B2 * | 2/2007 | Qiu .................. B82Y 20/00 250/338.4 |
| 8,853,526 | B2 | 10/2014 | Kostecki et al. |
| 8,917,014 | B2 | 12/2014 | Veerasamy |
| 9,105,791 | B1 | 8/2015 | Dyer et al. |
| 2002/0167023 | A1 | 11/2002 | Chavarkar et al. |
| 2003/0102482 | A1 | 6/2003 | Saxler |
| 2004/0155260 | A1 | 8/2004 | Kuzmik |
| 2005/0006639 | A1 | 1/2005 | Dupuis et al. |
| 2005/0117618 | A1 | 6/2005 | Tredicucci et al. |
| 2008/0087326 | A1 | 4/2008 | Scholes et al. |
| 2010/0261263 | A1 | 10/2010 | Vo-Dinh et al. |
| 2010/0270591 | A1 | 10/2010 | Ahn |
| 2011/0193092 | A1 * | 8/2011 | Passlack ............. B82Y 10/00 257/76 |
| 2011/0291109 | A1 | 12/2011 | Wraback et al. |
| 2012/0119205 | A1 * | 5/2012 | Taniguchi ........... H01L 29/7869 257/43 |
| 2012/0161098 | A1 | 6/2012 | Hiura et al. |
| 2012/0186641 | A1 | 7/2012 | Sharps et al. |
| 2012/0299011 | A1 | 11/2012 | Hikita et al. |
| 2014/0071316 | A1 * | 3/2014 | Asano .................. G02B 5/201 348/270 |
| 2015/0340439 | A1 | 11/2015 | Tsu et al. |
| 2017/0098716 | A1 * | 4/2017 | Li ..................... H01L 29/7391 |

OTHER PUBLICATIONS

Sep. 1, 2015 International Preliminary Report on Patentability issued in International Patent Application No. PCT/US2014/019032.
Feb. 26, 2016 Written Opinion issued in Singapore Patent Application No. 11201508691R.
U.S. Appl. No. 14/759,478, filed Jul. 7, 2015.
"5.3.1 Ideal Heterojunctions;" Dec. 31, 2011; retreived from https://web.archive.org/web/20111231132923/http:/www.tf.uni-kiel.de/matwis/amat/semi_en/kap_5/backbone/r5_3_1.html.
"Heterojunction Band Alignment;" Apr. 28, 2012; retreived from https://web.archive.org/web/20120428221418/http:/www.utdallas.edu/~frensley/technical/hetphys/node7.html.
"2.2.4 Simple Junctions and Devices;" Dec. 30, 2011; retreived from https://web.archive.org/web/20111230122847/http:/www.tf.uni-kiel.de/matwis/amat/semi_en/kap_2/backbone/r2_2_4.html.
Aug. 19, 2016 Written Opinion issued in Singapore Patent Application No. 11201508691R.
Oct. 11, 2016 Search Report issued in European Patent Application No. 14756491.8.
Baranov et al; "Observation of room-temperature laser emission from type III InAs/GaSb multiple quantum well structures;" Applied Physics Letters; vol. 71; No. 6; Aug. 11, 1997; pp. 735-738.
Yin et al; "Synthesis of InN/InP corelsheath nanowires;" Applied Physics Letters; vol. 84; No. 9; Mar. 1, 2004; pp. 1546-1548.
Sep. 29, 2016 Office Action issued in Canadian Patent Application No. 2,915,930.
Oct. 25, 2016 International Preliminary Report on Patentability issued in International Patent Application No. PCT/US2015/027789.
Dec. 1, 2016 Office Action issued in U.S. Appl. No. 14/759,478.
Feb. 2, 2017 Examination Report issued in Singaporean Patent Application No. 11201508691R.
Sep. 11, 2017 Office Action Issued in U.S. Appl. No. 14/759,478.
Unlu et al., Band offsets in III-nitride heterostructures, J. Phys. D: Appl Phys. 35 (2002) 591-594.
Ghezzi et al., Determination of the valence band offset of MOVPE-grown In0.48Ga0.52P/GaAs multiple quantum wells by admittance spectroscopy, Physical Review B 77, 125317 (2008).
Zhang et al., Band alignment of INN/GaAs heterojunctions determined by x-ray photoelectron spectroscopy, Applied Physics Letters 93, 122111 (2008).
Herbert Kroemer, Nobel Lecture: Quasielectric fields abd band offsets: teaching electrons new tricks, Reviews of Modern Physics, vol. 73, Jul. 2001.
Mikhailova et al., INterface-induced optical and transport phenomena in type II broken-gap single heterojunctions, Semicond. Sci. Technol. 19, 2004, R109-R128.
Aug. 23, 2017 Office Action issued in Canadian Patent Application No. 2,915,930.
May 19, 2017 Office Action Issued in U.S. Appl. No. 14/759,478.
Collazo et al.; "The Group III-Nitride Material Class: from Preperation to Perspectives in Photoelectrocatalysis;" chapter 8 of "Photoelectrochemical Water Splitting: Issues and Perspectives," ed. H-J. Lewerenz and L.M. Peter, Rsc Publishing (2013); pp. 193-222.
Wei; "III-Nitride Semiconductors for Photovoltaic Applications;" National Renewable Energy Laboratory; May 2003; 6 pp.
"Semiconductor Heterojunctions," The University of Toledo, Department of Physics and Astronomy; Feb. 14, 2012; 9 pp.
Stadelmann; "Antidot Superlattices in InAS—GaSb Double Herostructures: Transport Studies;" Ph.D. Thesis, University College, Oxford, 2006; 254 pp.
Nguyen et al.; "Surface donor contribution to electron Sheet concentrations in not-intentionally doped InAS—AlSb quantum wells;" Appl. Phys. Lett.; vol. 60; No. 15; 13 Apr. 1992, pp. 1854-1858.
Jul. 27, 2018 Office Action issued in U.S. Appl. No. 14/759,478.

* cited by examiner

E-distance band profile diagram of incoherent type-II structures with periodic inserted 2DILs E-k dispersion diagram band of an incoherent type-II super lattice structure

TYPE III HETROJUNCTION—BROKEN GAP HJ

CROSS-REFERENCE TO RELATED APPLICATION

This application claims priority to co-pending provisional patent application 62/188,806, filed Jul. 6, 2015, the disclosure of which is hereby incorporated in its entirety. This application is related to U.S. application Ser. No. 14/759,478 filed Jul. 7, 2015, the disclosure of which is hereby incorporated in its entirety.

BACKGROUND

Advances in solid state electronics over the last half-century have been predicated predominantly on improvements to and specialization of devices based on a p-n junction (also referred to herein as PN junction). Such improvements have been aimed at every aspect of device performance, from increased efficiency and yield to optimized frequency response, minimized noise, and more. Common p-n junction-based devices include diodes, transistors, triodes, LED's (including OLED's), etc. Such p-n junction-based devices form the core of the modern electronics industry.

However, the basic p-n junction has some fundamental and unavoidable drawbacks, some of which stem from the physical p-n junction itself. For example, the p-n junction requires the extrinsic doping of intrinsically electrically neutral semiconductor material with positive or negative ions to create the respective p- or n-type materials forming the junction. Such doping is expensive, can damage the semiconductor lattice, and increases scattering centers that can decrease carrier mobility and increase resistance. Further drawbacks of traditional p-n junction devices owe to subtleties in the physical motions of carriers within the junction, p-n band structure, and more, leading to various problems in creating exceptionally high-conductivity, high current, high power, and high frequency devices. Finally, PN junctions may be limited by the solid solubility of their constituent materials.

Moreover, as mentioned above, PN junctions are formed via doping where dopants, as Coulomb scattering center, results in high scattering with low mobility; whereas field effect transistors ("FETs") utilize boundary conditions result in charge transfer without Coulomb Centers for scattering of carriers. With the advent of Type III Heterostructures, where the valence band maximum of one may be above the conduction band minimum of the other, resulting in transfer of carriers from the filled valence band to be transferred to the adjacent empty conduction band, resulting in carrier transfer without doping. Depending on the hetero-structures involved, this type of carrier transfer may be way above the traditional solid solubility limit.

Unfortunately, the extra charges as center for scattering with drastic reduction of mobility as Coulomb scattering centers, which is the reason why PN-junctions are relegated to rectifiers as most semiconducting devices utilize metal-oxide-semiconductor field-effect transistor ("MOSFET"), and not PN junctions.

SUMMARY

Using heterojunctions having valence-band maximum above conduction-band minimum, results in useful device: type-III superlattices. If the layer thicknesses are more than the mean-free-path of electrons of holes, the overlapping energy-bands result in opening new band-gap, resulting in the so-called type-III superlattices. If the thicknesses are more than the mean-free-path, incoherent scattering results instead in the formation of carrier transfer via diffusion instead of opening up new energy gap.

The present disclosure discloses carrier transfer via diffusion using the proper heterojunctions without doping, to avoid Coulomb scattering. High concentration with high mobility follows for many heterojunction devices including the formation of plasmons free from scattering for many devices.

Due to these heterojunctions, one can form a semi-metallic FET using a "broken gap heterostructure," allowing the development of high power FETs.

According to one aspect, a semiconductor junction may include a first layer and a second layer. The first layer may include a first semiconductor material and the second layer is deposited on the first layer and may include a second material. The valence band maximum of the second material is higher than a conduction band minimum of the first semiconductor material, thereby allowing a flow of a majority of free carriers across the semiconductor junction between the first and second layers to be diffusive. The thickness of each of the first and second layers is greater than an electron mean-free-path of the semiconductor junction between the first and second layers.

According to another aspect, a method of forming a semiconductor junction may include depositing a first layer comprising a first semiconductor material at a first thickness, and depositing a second layer comprising a second material at a second thickness, wherein at least a portion of a valence band of the second material has a higher energy level than at least a portion of the conduction band of the first semiconductor material. A flow of a majority of free carriers across the semiconductor junction between the first and second layers is diffusive, and the first and second thicknesses of the first and second layers are greater than an electron mean-free-path of the semiconductor junction between the first and second layers.

According to another aspect, an optical modulator may include a substrate, a first layer, a first layer comprising a first semiconductor material deposited on the substrate, a second layer deposited on the first layer and comprising a second material, a first contact applied to the first layer, and a second contact applied to the second layer. At least a portion of a valence band of the second material has a higher energy level than at least a portion of the conduction band of the first semiconductor material, and a voltage bias is applied between the first and second contacts to modulate light incident to the second layer.

DETAILED DESCRIPTION OF EMBODIMENTS

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements. The terminology used herein is for the purpose of describing particular embodiments only and is not intended to be limiting of the invention.

As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Figure 6:
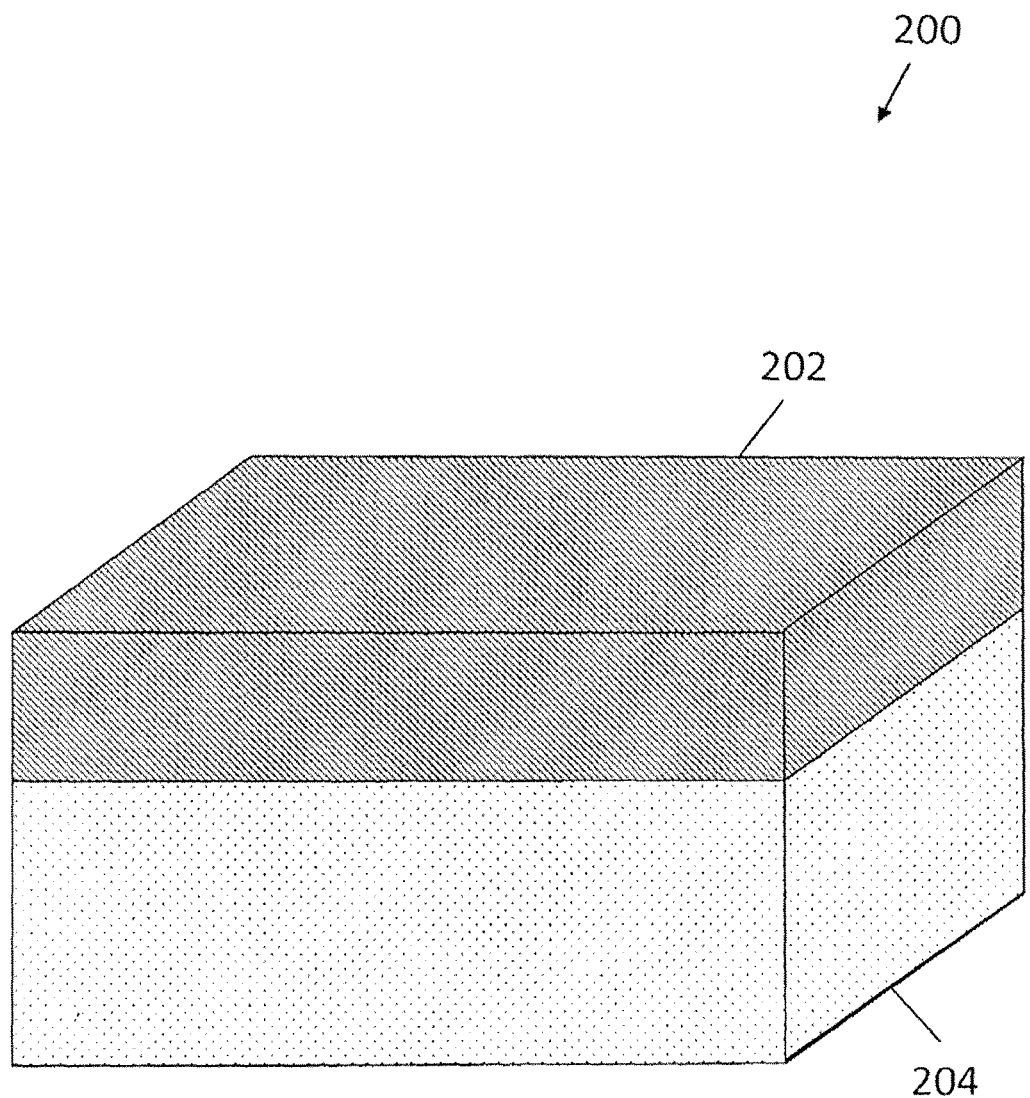
FIG. 6 illustrates one embodiment of a two-layer structure of a type-III heterojunction according to one embodiment.

Generally, the present disclosure describes a "type-III superlattice." FIG. 6 illustrates a structure 200 having a first layer comprising a first semiconductor material 202 and second layer comprising a second material 204. However, the materials of the first semiconductor material 202 and the second material 204 are such that the boundary between the materials consists of the overlapping conduction and valence bands of adjacent layers of materials such as InN/GaP alloys. At the crossing of these overlapping bands, the electron wave functions are no longer orthogonal because of interaction, which is particularly strong at energy-momentum crossings. The total interaction per unit volume determines the bandgaps, providing a means for bandgap engineering by design. This operating concept uses an InAs/GaSb system for bandgap engineering in the infrared light range. With an InN/GaP system, the optical response can be extended into the visible light range.

Overlapping of conduction and valence bands means, according to one embodiment, that the valence band maximum of a first layer is above the conduction band minimum of a second material, where one of the layers is deposited on the other layer to form an interface therebetween (as discussed above for FIG. 6)

Figure 1:
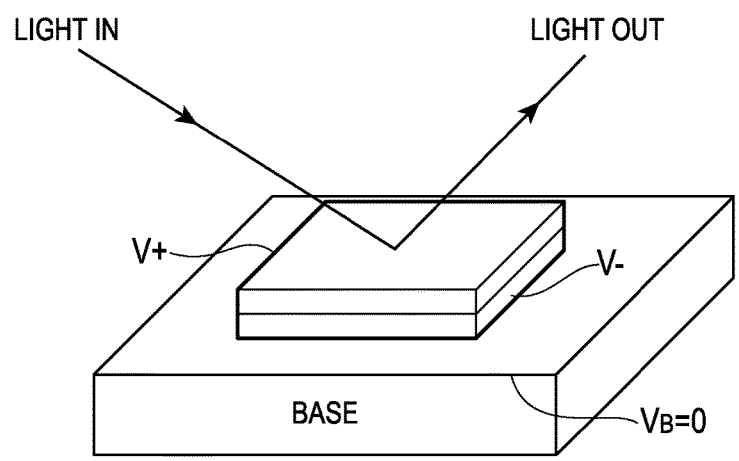
FIG. 1 illustrates a schematic of a structure with a heterojunction according to one embodiment of the present application.

FIG. 1 illustrates a possible configuration for an arrangement for a type II heterojunction with almost semi-metallic carrier transfer without doping, elimination high losses from Coulomb scattering. Both the base and active top layers may be selected with alloying of heterojunctions.

As shown in FIG. 1, a base (e.g., a substrate) used for allowing the first material to be deposited thereon (but the base is not required for the present invention in some embodiments).

Next, the next layer in FIG. 1 may be a first layer of a first material which may be formed by depositing the material on top of the base layer. The material of the first layer may be InN or AlN (having a thickness of at least 200 angstroms in one embodiment). In one embodiment, the base is not required to be present.

On top of the first layer is a second layer deposited. The second layer may comprise a thin layer (200 angstroms in one embodiment) of a second material deposited on the first material creating an interface. The material of the second layer may be any material that has a valence band that is above or greater than the conduction band minimum of the first material. In other words, the first and second materials are selected so that the valence band maximum of the first layer is above the conduction band minimum of the second layer, allowing carrier transfer from the full valence band into the empty conduction band. The materials can be any material which satisfies this condition such as, $Al_xGa_{1-x}N$ or $Al_xGa_{1-x}N_yP_{1-y}$, where x and y are variables which are used for lattice matching to reduce interfacial strain.

Figure 2:
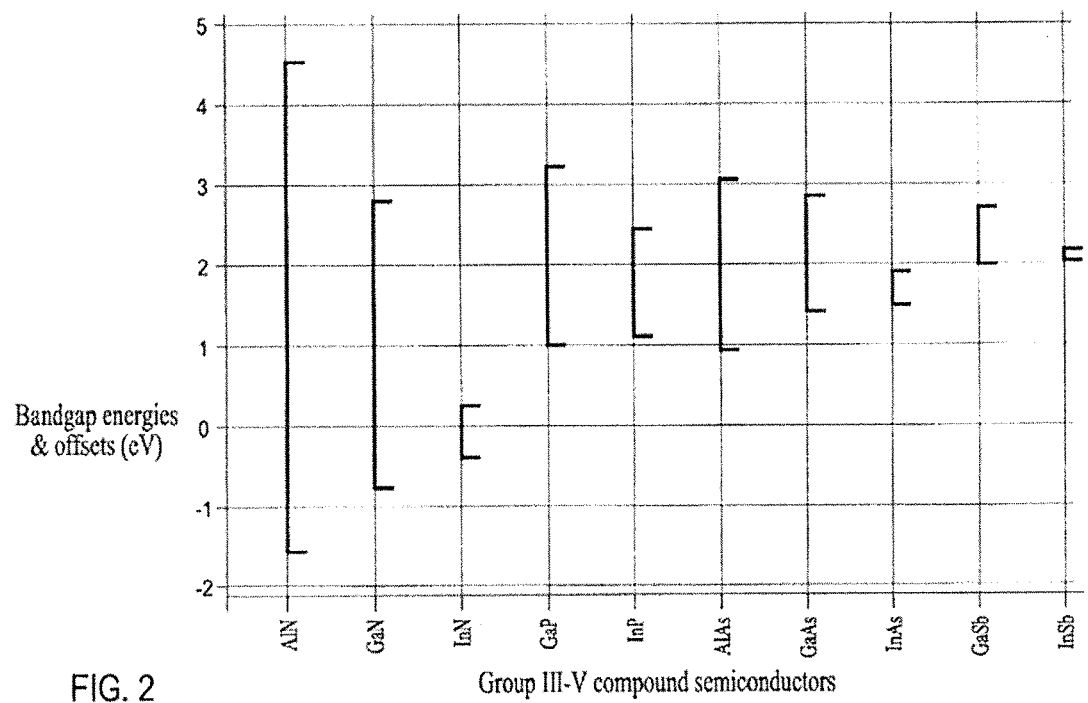
FIG. 2 illustrates bandgaps and offsets in selected group III-V compound semiconductors.

In one embodiment, the first layer may be InN and the second layer may be either AlP, GaP, InP, AlAs, GaAs, InAs, AlSb, GaSb, or InSb because each of these second layer materials has a valence band maximum that is above the conduction band minimum of InN (as shown in FIG. 2).

In another embodiment, the first layer may be InAs and the second layer may be either GaSb or InSb because each of these second layer materials has a valence band maximum that is above the conduction band minimum of InAs (as shown in FIG. 2).

It is noted that one of the layers has electron conduction and the other layer has hole conduction. Since the effective mass of electrons is generally lower than the hole effective mass, the electron velocity is generally higher than the hole velocity under an equal electric field. It is noted that, without Coulomb scattering, transport of both electrons and holes may be driven to non-linear regions taking advantage of parametric processes.

Also shown in FIG. 1, is that a first voltage connection (e.g., V+) may be attached to the second layer and introduces electronics on one side, and the second voltage connection (V−) is located on the first layer allowing for current to flow from the first voltage connection to the second voltage connection. For all intents and purposes, the top layer (e.g., the second layer) is transformed into semi-metallic, shown as electron current from the V+ connection to the V− connection. In fact, the current generated represent a meta-atom. Because the circuit representation involves both electric and magnetic fields with wide range of resonances without losses, an ideal man-made medium for impendence matching is created, serving a large variety of configurations with frequency from microwave to optical.

A bias is applied between V+ and V−. By doing this, any light entering the structure (shown in FIG. 1) can be modulated, and as such, the device of FIG. 1 can be used as an optical modulator.

The layers deposited in FIG. 1 may be selected with alloying of heterojunctions. The insulating base as well as the active layer for interaction with incident light may consist of specially selected $Ga_xIn_{1-x}N$ alloys, according to some embodiments.

Accordingly, the present disclosure utilizes electron transfer via diffusion from the valence band into the adjacent conduction band. This property creates a semi-metallic pn-junction without doping. The planar boundary permits coherent transfer with significantly reduced scattering because there is no doping. It behaves as an electron-hole semi-metallic junction, or 2D-EHSM system with carrier concentrations that are well over the solid solubility limit obtained by conventional doping, but now without any impurity scattering. In essence, this proposed EHSM-FET can lead to high power FETs with high efficiency because carrier scattering is eliminated even with high electron densities well above the present solid-solubility limit.

Furthermore, with proper choice of different alloy systems which have matching lattice constants, one can minimize interfacial strain. The latter results in an EHSM, exhibiting this "self-doping" transfer of carriers from the valence band to the adjacent overlapping conduction band to not only have minimal interfacial scattering of carriers, i.e. we have coherence, but also to permit a higher mobility FET at high carrier concentrations for high power FETs.

The inventors of the present disclosure also note that this Type III system also offers a wide range of new possibilities for tunable metamaterials according to some embodiments, and LED lighting, light detectors/sensors, light harvesting, etc. according to other embodiments.

Type III heterojunctions ("broken gap HJ") with the following combination of materials to form a structure (e.g., structure 200) AlAs, GaAs, InAs, GaSb, etc., as voltage tunable devices for effective bandgap in the infrared by design as well as have high mobility with almost semi-metallic conduction. The systems with AlN, GaN, InN, AlP, GaP, etc. have been developed in the visible spectrum and even the near UV range, may be developed as lattice matched type III heterojunctions. Moreover, if the layer thickness is greater than the mean-free-path of electrons and holes, instead of the formation of new energy gaps similar to the formation of molecular states, electrons from the higher valence band is transferred to the lower conduction band in terms of carrier diffusion, leading to the formation of carrier transfer via diffusion, the formation of large semi-metallic-like electron and hole densities without Coulomb scattering in doped junctions: high mobility semi-metallic system! The new features involve the following:

(1) Heterojunctions for bandgaps by design. (Coherent interactions)

(2) Overlapping valence-conduction band allows carrier transfer (similar to the MOSFET), not from doping creating Coulomb scattering, thereby creating high concentration up to semi-metallic, with only interfacial scattering, which may be further minimized by having lattice matched interface.

The above is a general discussion of various embodiments of the present application. More details and other embodiments are discussed below.

FIG. 2 illustrates bandgaps and offsets in selected group III-V compound semiconductors. As background, the valence band maximum is the bottom portion of each vertical line for each compound shown in the FIG. 2 graph, and the conduction band minimum is the top portion of each vertical line for each compound, also shown in the FIG. 2 graph.

As shown in FIG. 2, the valence band maximum of indium nitride ("InN") is above the conduction band minimum of gallium phosphide ("GaP,") allowing carrier transfer from the full valence band into the empty conduction band. It is noted that the degree of transfer may be voltage dependent. Therefore, AC modulation can provide additional device potentials such as parametric amplifications. In actual cases, addition flexibility will follow by combining varies binary alloys into ternary systems, e.g. $Al_xGa_{1-x}N$ or $Al_xGa_{1-x}N_yP_{1-y}$ quaternary systems, if nothing else, for lattice matching to eliminate interfacial strain.

To be sure and still referring to FIG. 2, the valence band for GaSb is some 0.1 eV above the conduction band minimum of InAs, resulting in electrons transfer from the valence band into the conduction band of InAs. The inventors found a way to move the point of inflection in the IV-characteristic, where negative resistance occurs in a GaSb/InAs superlattice structure (e.g., structure 200), possibly happening closer to the zone center. This may be desirable because it would have negative resistance at a lower applied voltage, for amplification to occur.

This overlapping conduction-valence band system created a new band-structure. Whenever two bands cross, at the crossing point, interaction pushes the crossing into bonding and anti-bonding state as the formation of molecular states from overlapping conduction-valence bands. Nevertheless, some new features appeared: narrow bands appeared, useful for infra-red detectors. This is referred to as type-III superlattices.

As shown in FIG. 2, band-gaps and off-sets of some II-VI compounds involving AlGaN systems, type-III superlattice may be developed to push the optical applications from infrared into the visible. This possibility has utility as photonic-electronic devices. However, also appealing with this invention is the possibility of developing into a new type of optoelectronic devices with very high mobility.

Figure 3B:
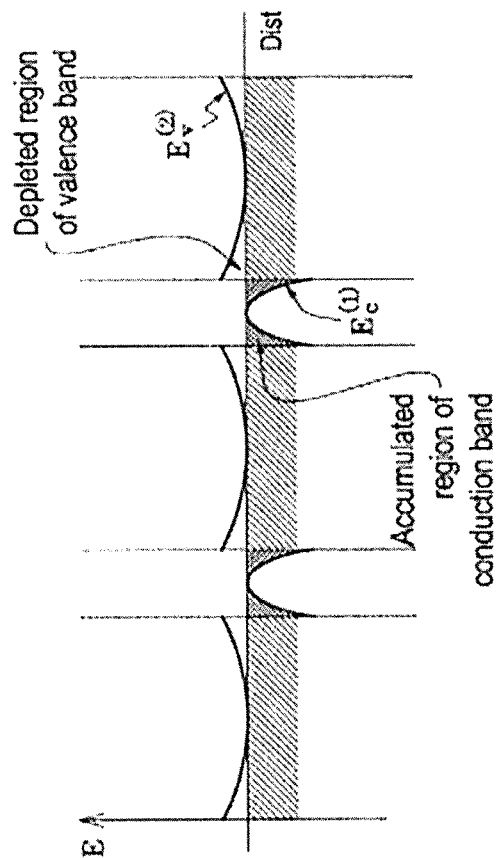
FIG. 3B shows E-distance band profile diagram of incoherent type-III structures with periodic inserted 2DILs.
Figure 3A:
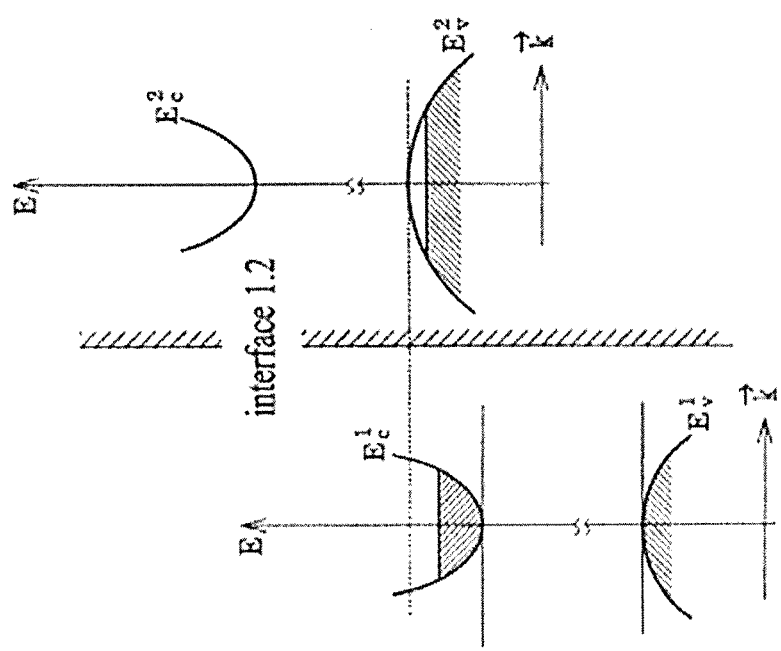
FIG. 3A presents an E-k dispersion diagram band of an incoherent type-III super lattice structure.

As discussed above, in reality PN junctions, except for rectifiers and situations not related to low noise applications, impurities generated via doping lower drastically the mobility because of Coulomb scattering from dopants. For example, when P is used as n-dopant, the extra negatively charged phosphorus sites represent highly efficient Coulomb scattering of the electrons and holes. For this reason, MOSFET is developed into something pushing aside doping semiconductors. However, the inventors consider heterostructures with valence band maximum above the conduction band minimum, electrons are transferred from the higher valence band into the contacting adjacent conduction band, resulting in electrons, with semi-metallic conductivity, without Coulomb scattering from the dopants. Moreover, with careful lattice matching, even the scattering from strained interface may be avoided. The only remaining scattering is phonon scattering. Particularly high scattering rate would be expected when the Fermi velocity is close to, and exceeding the phonon velocity. However, even this sort of scattering can be controlled by lowering the temperature to lower the density of states of phonons. In principle, therefore, we should be able to expect possibility of high mobility with high efficient optoelectronic devices As shown in FIGS. 3A and 3B, gallium phosphide ("GaP") lies above the conduction band minimum of InN, allowing transfer of electrons. FIG. 3A shows energy bands in k-space. Note that the curvature in the valence band at right is smaller than that of the conduction band, because the conduction band is usually having smaller effective mass with greater curvature than the valence band maximum.

FIG. 3B shows in configuration space, as in usual pn-junction, with three valence band maxima lined up with two conduction band minimum. Note that that the valence bands curve upward and conduction bands curve downward, which is unusual. This I is correct because this is not E-k, rather x is the distance as in the typical PN-junctions, energy profile.

A voltage applied to a single junction, electrons from the top of the higher valence band will flow into the bottom of the lower conduction band leaving holes in the valence band for conduction if S-D contacts are provided. On the other hand, these electrons from the top of the GaP valence band flow into the bottom of the InN conduction band give rise to conduction between S-D contacts are provided between the two sides of the conduction band of InN. Therefore, conduction in the S-D for the electrons in the bottom of the conduction band come from the top of the valence-band of GaP. If S-D contacts were put in onto the GaP, one would have two parallel S-D currents, one in the conduction band of InN, and a second one in the valence band of GaP. However, the signal from the conduction band will be greater although the number of electrons and holes are the same, the effective mass in the conduction band is usually significantly smaller than those in the valence band so that the S-D current in the InN should be significantly greater than that in the GaP, because the mobility is higher in the electron channel than the current in the hole channel.

This scheme may be also incorporated into metamaterials having conducting and nonconducting states depending on a voltage applied between the two type III layers, in this case, the InN with electron conduction and hole conduction in GaP, with the proper DC voltage. When the DC-voltage to induce carrier transfer is replaced by a modulating AC-field, obviously modulation would follow, resulting in a parametric system. Thus, the type III system would offer some of the most desirable control to produce a "BIAS" resulting in some advantageous modulation effects, such as, for example, a parametric amplifier without Johnson noise. As such, the device may be an optical modulator.

Figure 4A:
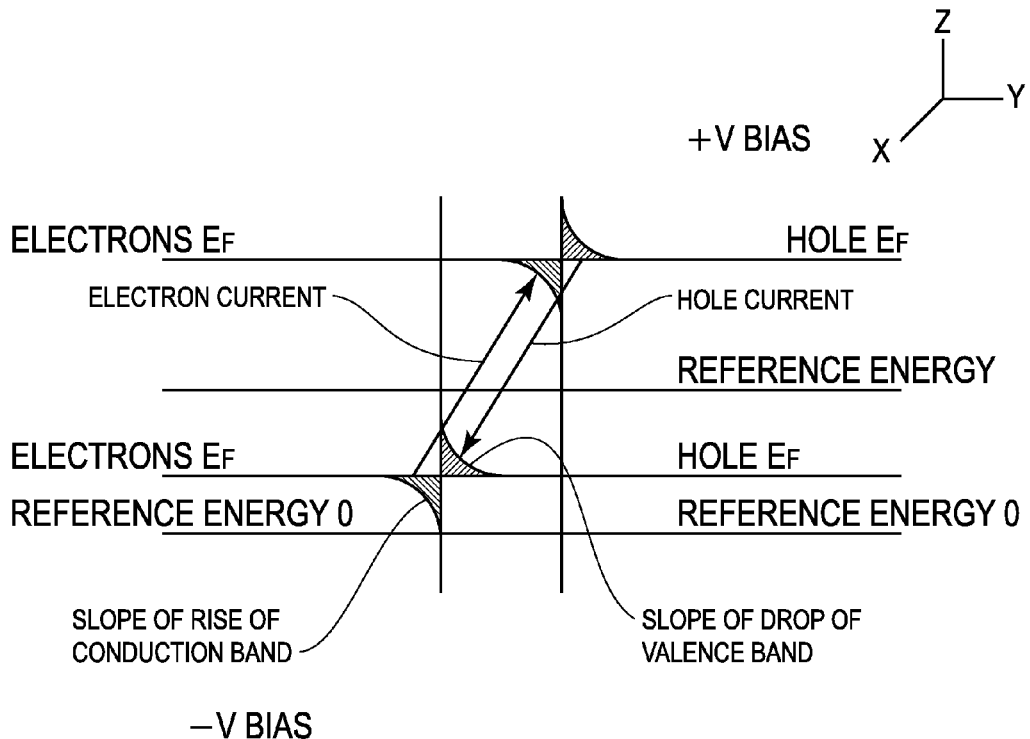
FIG. 4A illustrates two adjacent layers of two compositions such that the conduction band on the left side lies below the valence band maximum on the right, according to one embodiment.
Figure 4B:
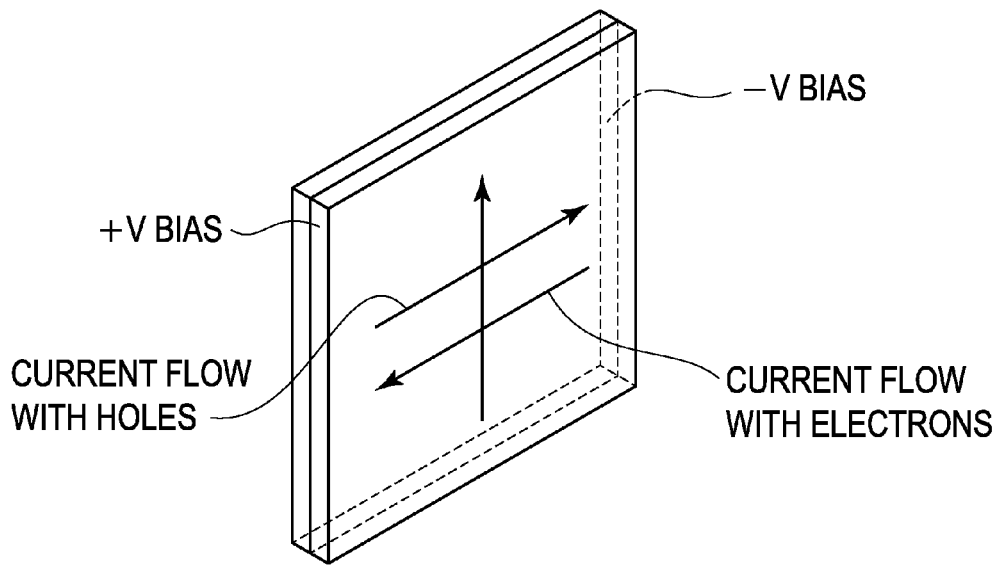
FIG. 4B illustrates a two-dimensional diagram in a XZ plane at a particular Y of the broken gap alignment, according to one embodiment.

FIGS. 4A-4B illustrates an how to get electrons and holes flowing under a bias voltage without scattering (using a structure such as that in structure 200). FIG. 4B shows a 2D plot in a XZ plane at a particular Y of the broken gap alignment, according to one embodiment.

In FIGS. 4A-4B, considered are two adjacent layers (e.g., 202, 204) of two compositions such that the conduction band on the left side of FIG. 4A lies below the valence band maximum on the right side of FIG. 4A. Overlapping results in diffusion of electrons from the valence band on the right side of FIG. 4A into the empty conduction band on the left side of FIG. 4A. Diffusion will continue until the rising Fermi level of the conduction band is lined up with the lowering of the Fermi level from the top of the valence band. Since the carrier cannot rise or fall instantly, the initial slope rising of the conduction band must be the same as the initial lowering of the valence band for equal effective masses. This is because there are always two, such as energy and momentum, voltage and the field at the point, etc. because basically, a second order differential equation is involved in diffusion processes, requiring the value and derivative to be equal.

The most likely manner of putting two adjacent layers together, side-by side, 2D layers in formation of a line of common boundary are selected where electrons flow on the side of the lower conduction band and holes flow on the side of the higher valence band. So basically current flows at the interface of the two 2D structure. In actual case, these 2D sheets may be several micron thick so that the interacting photons and electrons are coupled into plasmon. Therefore this scheme is desirable for the interacting light and surface plasmons, including metamaterials. The applied voltage is to accelerate these high mobility electrons into possible amplification of the surface plasmons. This drawing shows the possibility for interaction resulting in gain, whether as a detector, or as amplification not too different form the traveling wave tube using vacuum electronics.

As shown in FIG. 4A, the slope of rise of the conduction band must be equal to the slope of drop of the valence band. The potential and fields are both equal at the point of contact. But the initial bottom of the conduction band must rise to the same value as the top of the valence band to align the common Fermi level of the new conduction-valence bands.

It is noted that with the material system proposed herein for a type III heterojunction, the bandgap achievable exceeds that of the usual far-IR (e.g. ~25 µm wavelength using InAs:GaSb)) and can be in the visible (i.e. ~0.5 µm using GaN:AlN). Also, in this structure, the carrier concentration is far higher than can be achieved through doping and the material can take the form of a semi-metal. This makes a type III heterojunction a candidate material system, with lower losses, for all plasmonic applications currently being proposed, such as surface plasmon devices that convert light into electricity.

It is also noted that one can tune the plasma frequency of a type III structure with an applied voltage. This means one can design plasmonic devices and components to match the incident wavelength of choice. Furthermore, the type III junction region provides a highly efficient voltage tunable junction whose bias can tune the operating wavelength (i.e. bandgap) of a new generation of sources operating at higher powers and new lower noise detectors. The latter includes a new generation of photovoltaic technologies for solar energy harvesting that can be better tuned to the solar spectrum. The type III heterojunction is not bound by the 33% solar energy to electricity efficiency limit (Shockley-Queisser limit) of doped semiconductor pn junction devices due to decreased resistive losses and higher electron mobility.

Figure 5A:
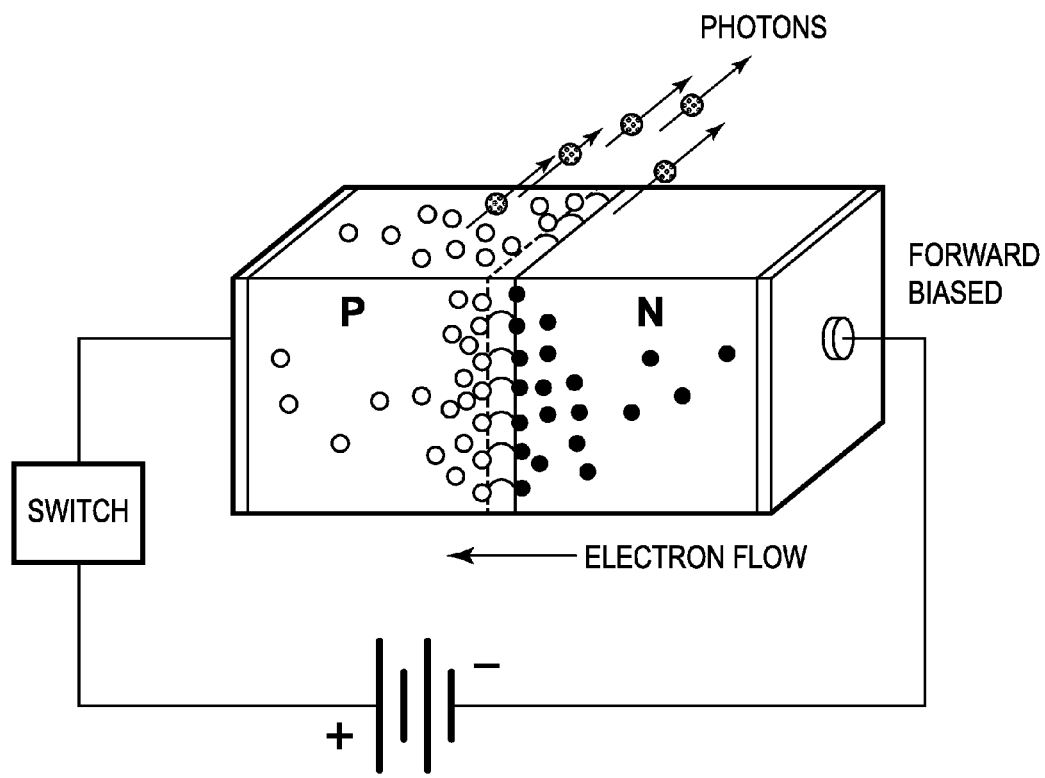
FIG. 5A shows a traditional forward biased pn junction emitter.
Figure 5B:
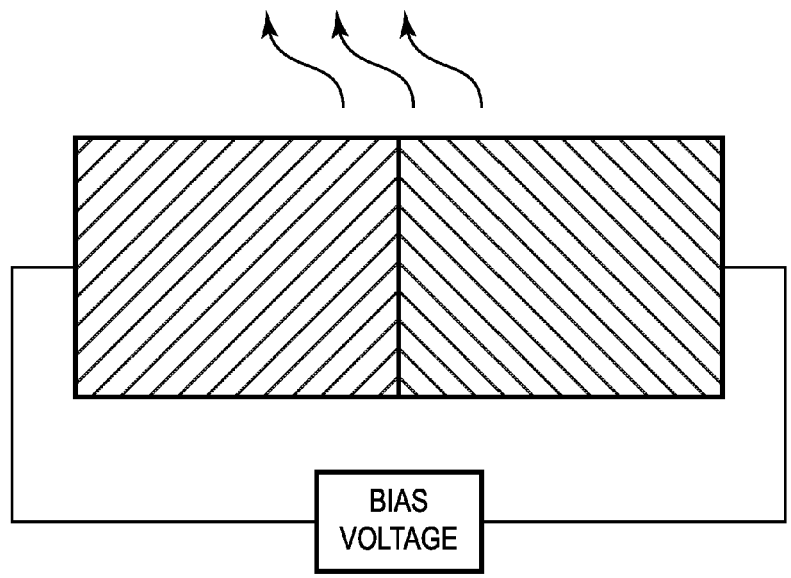
FIG. 5B illustrates the same geometry is possible for the type III heterojunction based emitter (or detector when reverse biased).

As shown in FIGS. 5A-5B, FIG. 5A shows a traditional forward biased pn junction emitter, and FIG. 5B illustrates the same geometry is possible for the type III heterojunction based emitter (or detector when reverse biased) but there are no longer any limitations due to doping.

What is claimed is:
1. A semiconductor junction comprising:
 a first layer comprising a first semiconductor material; and
 a second layer deposited on the first layer and comprising a second material,
 wherein a valence band maximum of the second material is higher than a conduction band minimum of the first semiconductor material, thereby allowing a flow of a majority of free carriers across the semiconductor junction between the first and second layers to be diffusive, and
 wherein the thickness of each of the first and second layers is greater than an electron mean-free-path of the semiconductor junction between the first and second layers.

2. The semiconductor junction of claim 1, wherein neither the first layer nor the second layer is doped.

3. The semiconductor junction of claim 1, further comprising a first contact applied only to the first layer and a second contact applied only to the second layer, wherein a voltage bias is applied between the first and second contacts to modulate light incident to the second layer.

4. The semiconductor junction of claim 1, wherein the first semiconductor material is InN and the second material is one of AlP, GaP, InP, AlAs, GaAs, InAs, AlSb, GaSb, or InSb.

5. The semiconductor junction of claim 1, wherein the first semiconductor material is InAs and the second material is GaSb or InSb.

6. The semiconductor junction of claim 1, wherein the first semiconductor material is a combination of GaN or AlN and one of AlP, GaP, InP, AlAs, GaAs, InAs, AlSb, GaSb, or InSb and the second material is one of AlP, GaP, InP, AlAs, GaAs, InAs, AlSb, GaSb, or InSb.

7. The semiconductor junction of claim 1, wherein at least one of the first layer or second layer comprise an alloy comprising $Ga_xIn_{1-x}N$.

8. The semiconductor junction of claim 1, wherein the first layer is $Al_xGa_{1-x}N_yP_{1-y}$, where x and y are variables which are used for lattice matching to reduce interfacial strain, and wherein the second layer is one of AlP, GaP, InP, AlAs, GaAs, InAs, AlSb, GaSb, or InSb.

9. The semiconductor junction of claim 1, wherein the first layer is deposited directly on top of the second layer.

10. A voltage tunable plasmonic device having the semiconductor junction of claim 1.

11. A transparent conductor for photovoltaic device having the semiconductor junction of claim 1.

12. A method of forming a semiconductor junction comprising:
depositing a first layer comprising a first semiconductor material at a first thickness; and
depositing a second layer comprising a second material at a second thickness, wherein at least a portion of a valence band of the second material having a higher energy level than at least a portion of the conduction band of the first semiconductor material,
wherein a flow of a majority of free carriers across the semiconductor junction between the first and second layers is diffusive, and
wherein the first and second thicknesses of the first and second layers is greater than an electron mean-free-path of the semiconductor junction between the first and second layers.

13. The method of claim 12, further comprising selecting the first semiconductor material and the second material so that a valence band maximum of the first semiconductor material is above the conduction band minimum of the second material.

14. The method of claim 12, wherein the first semiconductor material is InN and the second material is GaP.

15. The method of claim 12, wherein the first semiconductor material is InN and the second material is one of AlP, GaP, InP, AlAs, GaAs, InAs, AlSb, GaSb, or InSb.

16. The method of claim 12, wherein the first semiconductor material is InAs and the second material is GaSb or InSb.

17. The method of claim 10, further comprising modulating light incident to the second layer by applying a voltage bias to a first contact attached to the second layer and a second contact attached to the first layer so that light reflecting from the second layer is modulated.

18. An optical modulator comprising:
a substrate;
a first layer comprising a first semiconductor material deposited on the substrate;
a second layer deposited on the first layer and comprising a second material, wherein at least a valence band of the second material has a higher energy level than at least a portion of the conduction band of the first semiconductor material,
a first contact applied to the first layer; and
a second contact applied to the second layer,
wherein a voltage bias is applied between the first and second contacts to modulate light incident to the second layer.

19. The optical modulator of claim 18,
wherein a flow of a majority of free carriers across the semiconductor junction between the first and second layers is diffusive, and
wherein the thickness of each of the first and second layers is greater than an electron mean-free-path of the semiconductor junction between the first and second layers.

20. The optical modulator of claim 18, wherein the first semiconductor material is one of: (1) InN, (2) InAs, or (3) a combination of GaN and AlN and one of AlP, GaP, InP, AlAs, GaAs, InAs, AlSb, GaSb, or InSb, and
wherein the second material is one of AlP, GaP, InP, AlAs, GaAs, InAs, AlSb, GaSb, or InSb.

* * * * *